United States Patent [19]

Hidaka et al.

[11] Patent Number: 4,736,343

[45] Date of Patent: Apr. 5, 1988

[54] DYNAMIC RAM WITH ACTIVE PULL-UP CIRCUIT

[75] Inventors: Hideto Hidaka; Kazuyasu Fujishima; Masaki Kumanoya; Hideshi Miyatake; Katsumi Dosaka; Yasuhiro Konishi, all of Hyogo, Japan

[73] Assignee: Mitsubishi Denki Kabushiki Kaisha, Tokyo, Japan

[21] Appl. No.: 929,370

[22] Filed: Nov. 12, 1986

[30] Foreign Application Priority Data

Nov. 13, 1985 [JP] Japan .................................. 60-257083

[51] Int. Cl.$^4$ .............................................. G11C 11/24
[52] U.S. Cl. .................................... 365/203; 365/149; 365/205; 365/210
[58] Field of Search ............... 365/149, 189, 203, 205, 365/210

[56] References Cited

U.S. PATENT DOCUMENTS

| | | | |
|---|---|---|---|
| 4,417,329 | 11/1983 | Mezawa et al. ..................... | 365/203 |
| 4,503,343 | 3/1985 | Ohuchi .............................. | 365/203 |
| 4,578,781 | 3/1986 | Ogawa et al. ...................... | 365/203 |
| 4,601,017 | 7/1986 | Mochizuki et al. ................. | 365/189 |

OTHER PUBLICATIONS

"A High Performance Sense Amplifier for a 5 V Dynamic RAM", J. J. Barnes et al., IEEE Journal of Solid-State Circuits, vol. SC-15, No. 5, Oct. 1980, pp. 831–839.

Primary Examiner—James W. Moffitt
Attorney, Agent, or Firm—Lowe, Price, LeBlanc, Becker & Shur

[57] ABSTRACT

44Gate potentials of transistors $Q_{R0}$ and $Q_{R1}$ provided in an active pull-up circuit APo are always controlled to be appropriate values by a clock signal $\phi_p$. As a result, reverse flow of electric charge from a capacitor $C_{R0}$ or $C_{R1}$ to a bit line LB or $\overline{BL}$ can be prevented and unfavorable influence due to such reverse flow of electric charge can be avoided in operation of the active pull-up circuit APo.

5 Claims, 6 Drawing Sheets

DYNAMIC RAM WITH ACTIVE PULL-UP CIRCUIT

BACKGROUND OF THE INVENTION

1. Field of the Invention

The present invention relates to a semiconductor memory device and particularly to a semiconductor memory device such as a dynamic RAM comprising an active pull-up circuit.

2. Description of the Prior Art

In a dynamic MOS RAM, an active pull-up circuit operates after sense amplification of a bit line potential according to stored data in a memory cell, whereby the bit line potential on the side of a high level is pulled up to power supply voltage Vcc.

Figure 1:
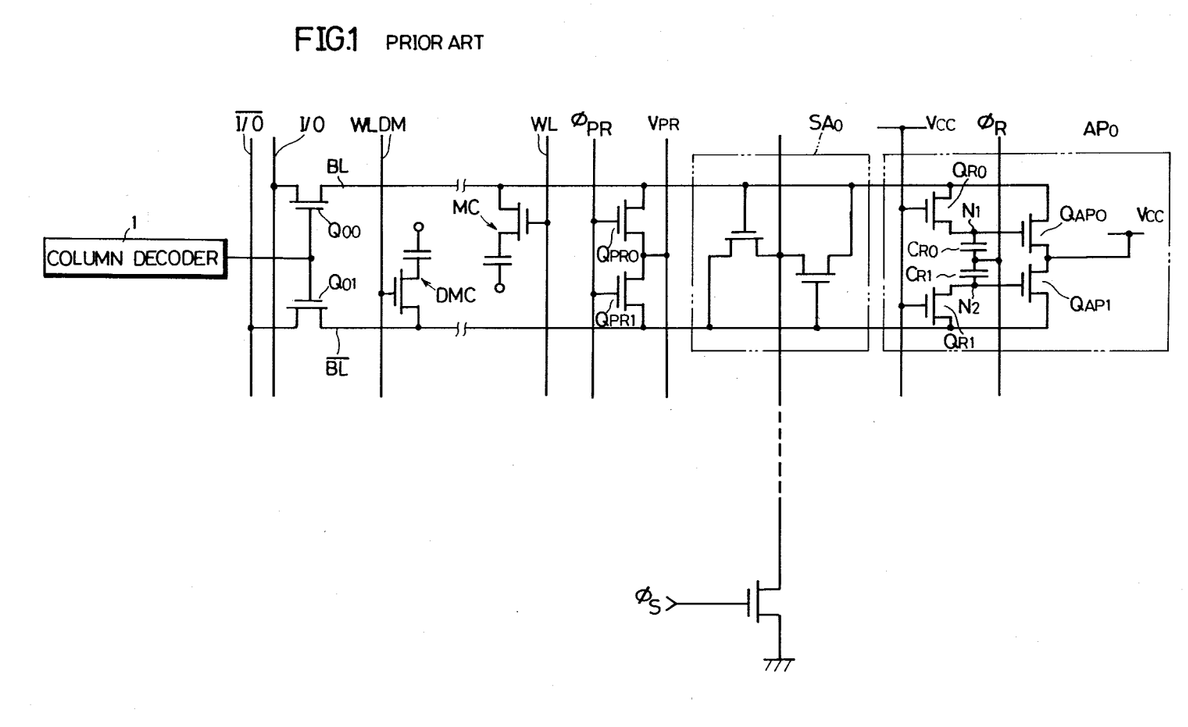
FIG. 1 is a circuit diagram showing a sense system in a conventional dynamic RAM.

FIG. 1 is a circuit diagram showing a bit line sense system in a conventional dynamic RAM. Referring to FIG. 1, a pair of bit lines BL and $\overline{BL}$ are connected to the data buses I/O and $\overline{I/O}$ through transistors $Q_{00}$ and $Q_{01}$, respectively. On-off control of the transistors $Q_{00}$ and $Q_{01}$ is made by on an output of a column decoder 1. Memory cells MC of a one-transistor one-capacitor type for example are connected to each of the bit lines in an alternate manner. FIG. 1 shows only one memory cell for the purpose of simplification of the illustration. Each memory cell MC is connected with an associated word line WL. By selecting suitably word line WL, control is made to connect or disconnect the memory cell MC with or from the associated bit lines BL and $\overline{BL}$. A dummy memory cell DMC is connected with each of the bit lines BL and $\overline{BL}$. FIG. 1 shows only a dummy memory cell DMC connected with a bit line $\overline{BL}$. Each dummy memory cell DMC is connected with an associated dummy word line WLDM. By selecting suitably dummy word line WLDM, control is made to connect or disconnect the dummy memory cell DMC with or from the associated bit lines BL and $\overline{BL}$. The bit lines BL and $\overline{BL}$ are connected to a precharge power supply $V_{PR}$ through the respective associated transistors $Q_{PR0}$ and $Q_{PR1}$. On-off control of the transistors $Q_{PR0}$ and $Q_{PR1}$ is made by a clock signal $\phi_{PR}$.

Each pair of bit lines BL and $\overline{BL}$ are further connected with a sense amplifier $SA_0$ and an active pull-up circuit $AP_0$. The sense amplifier $SA_0$ detects potentials of the associated bit lines after selection of a memory cell and makes the potential of the bit line of the low level correspond to a ground level. Operation of the sense amplifier $SA_0$ is controlled by a clock signal $\phi_S$. The active pull-up circuit $AP_0$ comprises transistors $Q_{AP0}$, $Q_{R0}$ and a capacitor $C_{R0}$ associated with the bit line BL as well as transistors $Q_{AP1}$, $Q_{R1}$ and a capacitor $C_{R1}$ associated with the bit line $\overline{BL}$. The transistor $Q_{AP0}$ serves to pull up the bit line BL and this transistor is provided between the bit line BL and the power supply Vcc. The capacitor $C_{R0}$ serves to increase gate potential of the transistor $Q_{AP0}$. An end of the capacitor $C_{R0}$ is connected to a gate of the transistor $Q_{AP0}$ and the other end thereof receives a clock signal $\phi_R$. The transistor $Q_{R0}$ serves to precharge the capacitor $C_{R0}$ with a precharge voltage of the bit line BL and this transistor is provided between the bit line BL and the above stated one end of the capacitor $C_{R0}$. A gate of the transistor $Q_{R0}$ is connected to the power supply Vcc. The transistors $Q_{R1}$, $Q_{AP1}$ and the capacitor $C_{R1}$ as the circuit elements associated with the bit line $\overline{BL}$ are provided symmetrically with respect to the transistors $Q_{R0}$, $Q_{AP0}$ and the capacitor $C_{R0}$ as the circuit elements associated with the bit line BL.

In reality, a semiconductor memory includes a plurality of sets of bit lines BL and $\overline{BL}$ and accordingly memory cells MC are arranged in a matrix.

Figure 2:
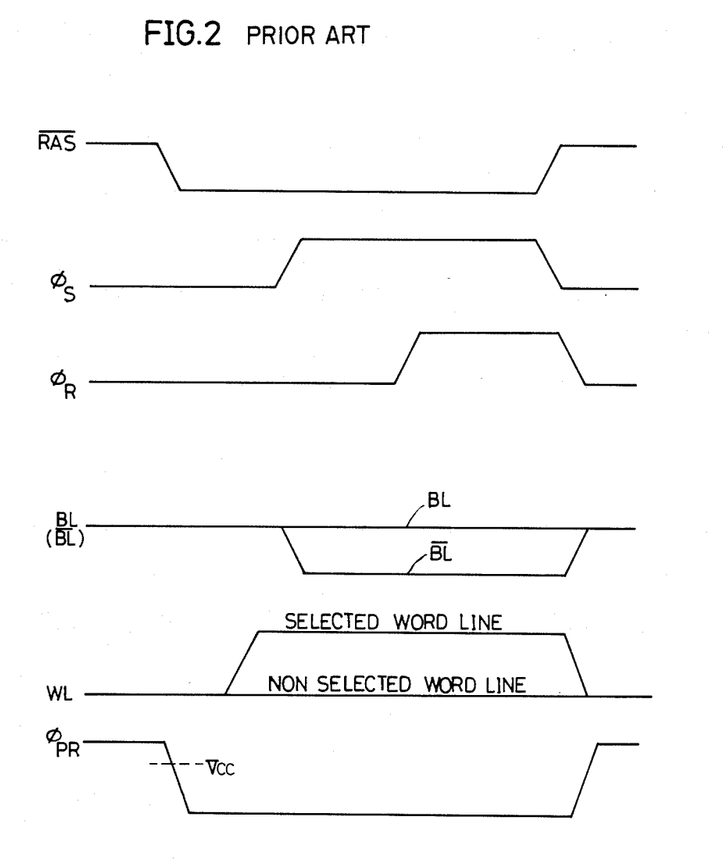
FIG. 2 is a timing chart for explaining operation of the dynamic RAM shown in FIG. 1.

FIG. 2 is a timing chart for explaining operation of the circuit shown in FIG. 1. Referring to FIG. 2, $\phi_S$, $\phi_R$ and $\phi_{PR}$ correspond to the respective clock signals shown in FIG. 1; BL and $\overline{BL}$ represent change in potential of the bit lines BL and $\overline{BL}$; and WL represents change in potential of the word line WL. $\overline{RAS}$ represents a row address strobe signal. The row address strobe signal $\overline{RAS}$ is a signal for defining a non-active period and an active period. In the following, the operation of the circuit shown in FIG. 1 will be described with reference to FIG. 2.

In the non-active period, namely, in a period of a high level of the row address strobe signal $\overline{RAS}$, the bit lines BL and $\overline{BL}$ are precharged with a predetermined potential. More specifically, the transistors $Q_{PR0}$ and $Q_{PR1}$ are turned on in response to the clock signal $\phi_{PR}$ and the bit lines BL and $\overline{BL}$ are precharged with a potential $V_{PR}$ ($V_{PR}=$Vcc). At this time, the capacitors $C_{R0}$ and $C_{R1}$ are charged through the transistors $Q_{R1}$ and $Q_{R2}$, respectively.

After that, the level of the row address strobe signal $\overline{RAS}$ falls to start the active period. In the active period, one of the word lines WL and one of the dummy word lines WLDM are selected and the potentials of the respective selected line rise to a high level. By this selection, the contents stored in the associated memory cell MC and the associated dummy memory cell DMC appear on the bit lines and imbalance of potential occurs between the bit lines BL and $\overline{BL}$. It is assumed in this case that the potential of the bit line $\overline{BL}$ becomes lower than the potential of the bit line BL. After the above stated selection, the clock signal $\phi_S$ rises to enable the sense amplifier $SA_0$. As a result, the bit line $\overline{BL}$ of the low level becomes equal to the ground level. Consequently, the capacitor $C_{R1}$ is discharged to emit the electric charge stored in the capacitor $C_{R1}$ to the bit line $\overline{BL}$ (at the ground level) through the transistor $Q_{R1}$ and accordingly potential at a node $N_2$ (a point of connection between the gate of the transistor $Q_{AP1}$ and the capacitor $C_{R1}$) becomes equal to the ground level. On the other hand, potential at a node $N_1$ (a point of connection between the gate of the transistor $Q_{AP0}$ and the capacitor $C_{R0}$) becomes $V_{PR}-V_{R0}$ ($V_{R0}$ being threshold voltage of the transistor $Q_{R0}$) After that, the clock signal $\phi_R$ rises to a potential higher than the power supply voltage Vcc to start active pull-up operation. Then, the node $N_1$ attains a higher potential (a potential higher than the power supply voltage Vcc) by boost effect of the capacitor $C_{R0}$ and the transistor $Q_{AP0}$ is conducted to a very high degree. Accordingly, the potential of the bit line BL rises to the power supply voltage Vcc. On the other hand, since the potential at the node $N_2$ is the ground level, the transistor $Q_{AP1}$ does not turn on and the potential of the bit line $\overline{BL}$ remains the ground potential.

Such a conventional circuit as described above is described for example in "A High Performance Sense Amplifier for a 5V Dynamic RAM" by John J. Barnes and John Y. Chan, IEEE JOURNAL OF SOLID-STATE CIRCUITS, Vol. SC-15, No. 5, Oct. 1980 pages 831-839.

In the above described conventional example, the bit lines BL and $\overline{BL}$ are precharged to the potential $V_{PR}$=Vcc before the start of operation of the sense amplifier SAo. However, the precharge voltage is not always set to the power supply voltage Vcc and it is sometimes set to an intermediate value (for example ($\frac{1}{2}$) Vcc) between the power supply voltage Vcc and the ground potential. Setting of the precharge voltage to such an intermediate value is advantageous for the purposes of decreasing consumption of electric power and applying sense timing at high speed. However, if the precharge voltage of the bit lines BL and $\overline{BL}$ is set to an intermediate value between the power supply voltage Vcc and the ground potential, the potential at the node $N_1$ hardly increases, which makes it impossible to perform active pull-up operation. The cause of this phenomenon will be described in detail in the following.

Assuming that the bit lines BL and $\overline{BL}$ is precharged with a voltage ($\frac{1}{2}$) Vcc, the gate potential of the transistor $Q_{R0}$ becomes equal to the power supply voltage Vcc and the source potential (potential at a terminal connected with the bit line BL) becomes equal to ($\frac{1}{2}$) Vcc. Accordingly, since forward bias is always applied between the gate and the source of the transistor $Q_{R0}$, the transistor $Q_{R0}$ is always in the on state. As a result, even if electric charge is stored in the capacitor $C_{R0}$ by the increase of the potential of the clock signal $\phi_R$, the stored electric charge is made to flow out to the bit line BL through the transistor $Q_{R0}$. Since the stray capacitance of the bit line BL is considerably large, even if electric charge is stored in the capacitor $C_{R0}$ by the clock signal $\phi_R$, the stored electric charge is immediately made to flow out to the bit line BL. Accordingly, the potential at the node $N_1$ hardly rises and the transistor $Q_{AP0}$ cannot be conducted to a high degree. Thus, the connection between the bit line BL and the power supply Vcc is weakened and active pull-up operation cannot be performed in a satisfactory manner.

As described above, a conventional dynamic RAM involves a disadvantage that active pull-up operation cannot be performed if the precharge level of the bit lines is set to a value lower than the power supply voltage Vcc.

SUMMARY OF THE INVENTION

Therefore, an object of the present invention is to provide a semiconductor memory device in which active pull-up operation can be performed stably even if a precharge level of the bit lines is set to a value lower than power supply voltage.

Briefly stated, the present invention is a semiconductor memory device comprising an active pull-up circuit for each pair of bit lines and in this semiconductor memory device, gate potential of a second transistor included in the active pull-up circuit is controlled so as to prevent reverse flow of electric charge from a capacitor included in the active pull-up circuit to the bit lines.

According to the present invention, it is made possible, with little change in a construction of a conventional semiconductor memory device, to obtain a semiconductor memory device including an active pull-up circuit capable of effectively operating even if precharge potential for bit lines is set to a value lower than the power supply voltage.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
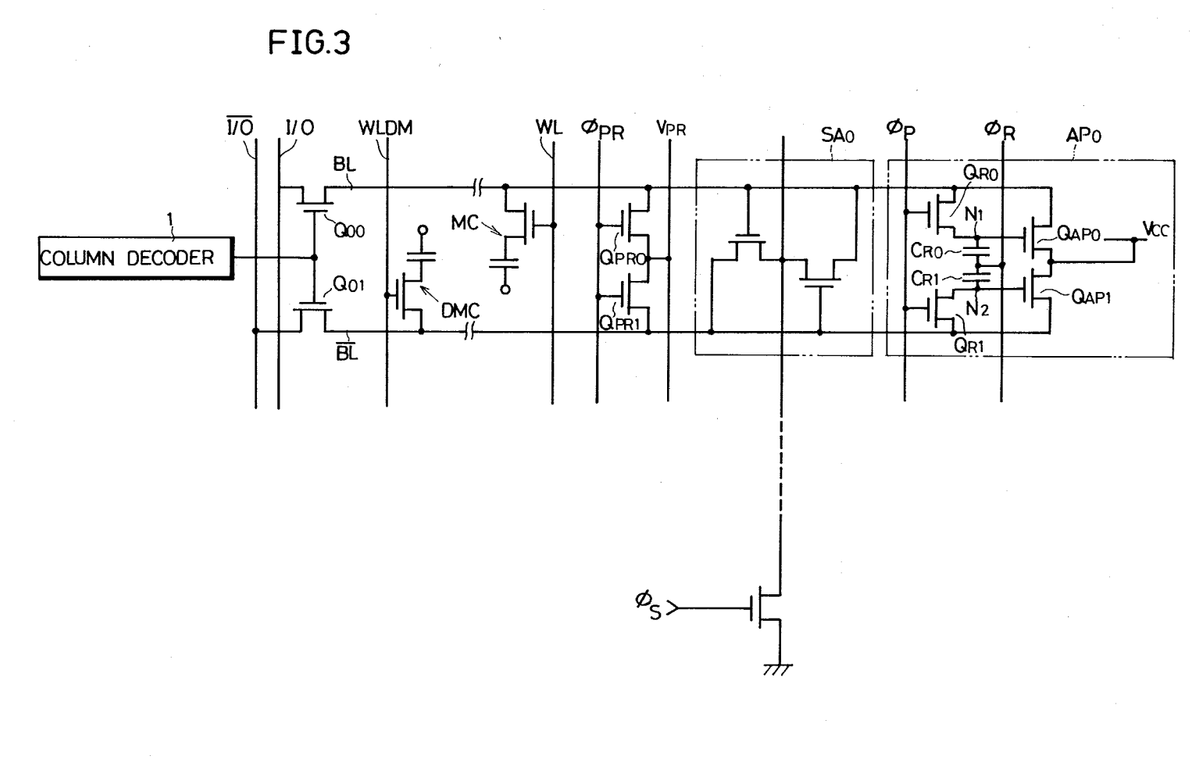
FIG. 3 is a circuit diagram showing a semiconductor memory device of an embodiment of the present invention.

FIG. 3 is a circuit diagram showing an embodiment of the present invention. This embodiment in FIG. 3 is different from the conventional example shown in FIG. 1 in that, in this embodiment, a clock signal $\phi_P$ is inputted to the gates of the transistors $Q_{R0}$ and $Q_{R1}$ for charging the capacitor. The other construction is the same as in the circuit shown in FIG. 1 and by denoting the corresponding portions by the same reference numerals, description thereof is omitted.

Figure 4:
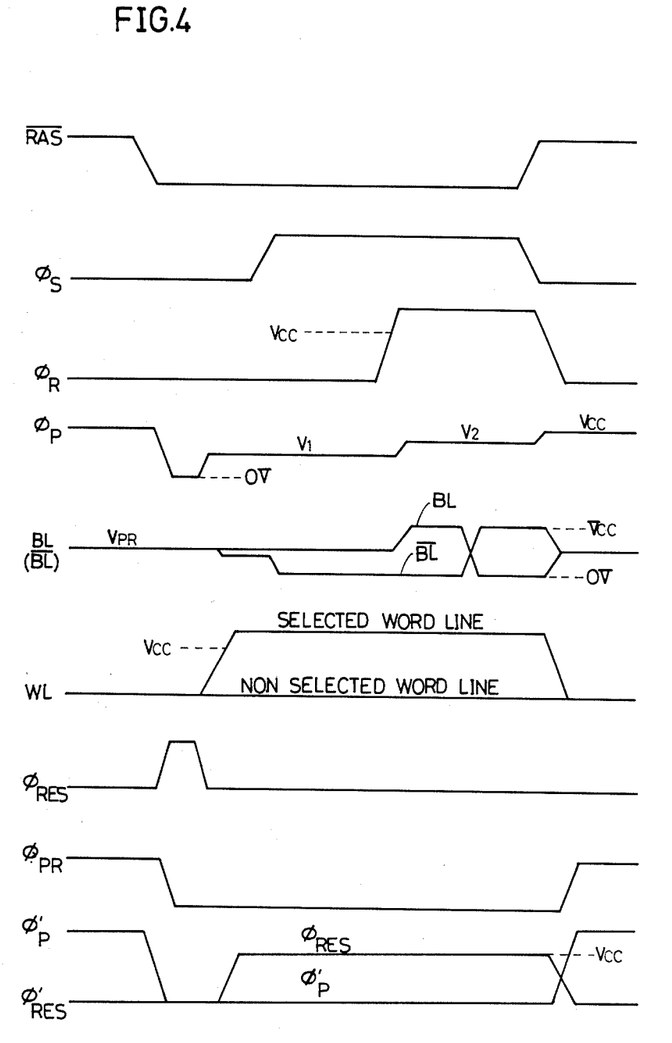
FIG. 4 is a timing chart for explaining operation of the semiconductor memory device shown in FIG. 3.

FIG. 4 is a timing chart for explaining operation of the circuit shown in FIG. 3. In the following, operation of the circuit shown in FIG. 3 will be described with reference to FIG. 4.

In this embodiment, it is assumed that the bit lines BL and $\overline{BL}$ are precharged with a voltage $V_{PR}$ ($V_{PR}$<Vcc) for the purposes of decreasing consumption of electric power and applying early sense timing. A word line and a dummy word line are selected in the same manner as in the above described conventional example and the contents stored in the memory cell MC and the dummy memory cell DMC are read out on the bit lines. As a result, imbalance of potential occurs between the bit lines BL and $\overline{BL}$. In this case, it is assumed that the potential of the bit line $\overline{BL}$ becomes lower than the potential of the bit line BL. After that, operation of the sense amplifier $SA_0$ is performed with the clock signal $\phi_P$ being held to a potential V1 which satisfies the condition of the following equation (1).

$$V1 < V_{PR} + V_{R0} \ldots \quad (1)$$

$V_{R0}$ in the equation (1) is a threshold voltage of the transistor $Q_{R0}$ and this voltage $V_{R0}$ is also equal to a threshold voltage $V_{R1}$ of the transistor $Q_{R1}$.

By the operation of the sense amplifier SA0, the bit line $\overline{BL}$ becomes equal to the ground potential. At this time, since the gate of the transistor $Q_{R1}$ is maintained to the above stated potential V1, the transistor $Q_{R1}$ is turned on and the node N2 also becomes equal to the ground potential. In the meantime, the node N1 remains at the high potential $V_{PR}$ ($V_{PR}$<Vcc) attained by precharge in the non-active period.

When the clock signal $\phi_R$ rises to start active pull-up operation, the node N1 rises to a sufficiently high potential. This is because the potential of the clock signal $\phi_P$, namely, the gate potential V1 of the transistor $Q_{R0}$ is lower than the sum of the potential $V_{PR}$ of the bit line BL and the threshold voltage $V_{R0}$ to cause a low degree of conduction of the transistor $Q_{R0}$, resulting in little flow of electric charge stored in the capacitor $C_{R0}$.

Accordingly, the voltage at the node N1 is sufficiently increased by the boost effect of the capacitor $C_{R0}$ and as a result the transistor $Q_{AP0}$ is conducted to a high degree to pull up the bit line BL on the high level side to the power supply voltage Vcc.

After the completion of above described pull-up operation, the clock signal $\phi_P$ is made to rise to a potential V2 which satisfies the condition of the following equation (2).

$$V2 < Vcc + V_{R0} \ldots \quad (2)$$

This is for the purposes of making the gate potential of the pull-up transistor $Q_{AP0}$ of the bit line BL on the high level side easily fall to the low level and making the potential of the bit line BL rapidly fall to the low potential (ground potential) in case where data is rewritten after the pull-up operation. Therefore, the potential of the clock signal $\phi_P$ may be made to rise to V2 only when data is rewritten. The potential V2 is preferably a high value and if the condition $V2 > V_{PR} + V_{R0}$ is selected, the below described step of raising the potential of the clock signal $\phi_P$ to the power supply voltage Vcc may be omitted.

In addition, when the row address strobe signal $\overline{RAS}$ rises to start the non-active period, the bit lines BL and $\overline{BL}$ are precharged with the potential $V_{PR}$ and the clock signal $\phi_P$ rises to the power supply voltage Vcc. As a result, the transistors $Q_{R0}$ and $Q_{R1}$ are in the on state and the nodes N1 and N2 are precharged with the potential $V_{PR}$ equal to that of the bit lines BL and $\overline{BL}$ in the same manner as in the conventional circuit.

Figure 5:
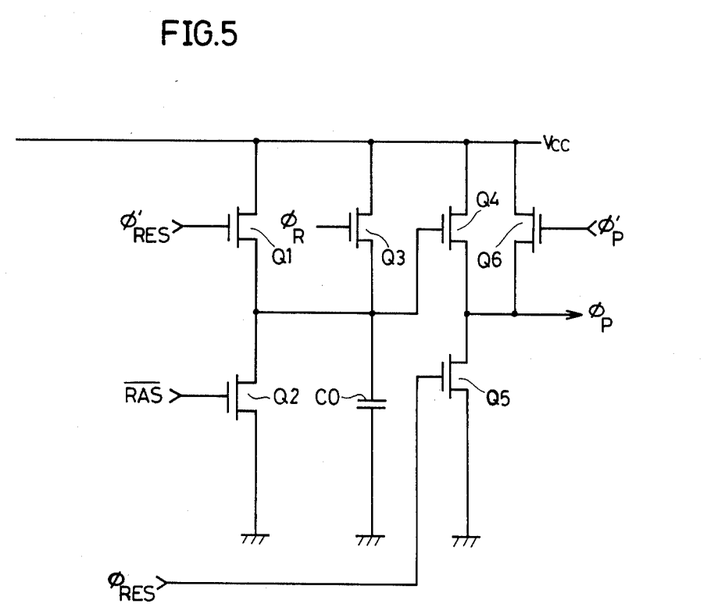
FIG. 5 is a diagram showning an example of a circuit for generating a clock signal $\phi_P$.

FIG. 5 is a diagram showing an example of a circuit for generating the clock signal $\phi_P$ used in the circuit shown in FIG. 3. Referring to FIG. 5, a portion comprising transistors Q1 and Q2 connected in series, a portion comprising a transistor Q3 and a capacitor C0 connected in series, and a portion comprising transistors Q4 and Q5 connected in series are provided in parallel between the power supply Vcc and the ground. In addition, the transistor Q6 is connected in parallel with the transistor Q4. The gate of the transistor Q1 receives a clock signal $\phi'_{RES}$. The gate of the transistor Q2 receives the row address strobe signal $\overline{RAS}$. The gate of the transistor Q3 receives a clock signal $\phi_R$. The gate of the transistor Q4 is connected to a node between the transistors Q1 and Q2 and is also connected to a node between the transistor Q3 and the capacitor C0. The gate of the transistor Q5 receives a clock signal $\phi_{RES}$. The gate of the transistor Q6 receives a clock signal $\phi'_P$. A clock signal $\phi_P$ is provided from a node among the transistors Q4, Q5 and Q6. The operation timing of the circuit shown in FIG. 5 is also illustrated in the timing chart of FIG. 4. Referring to FIG. 4, the operation of the circuit in FIG. 5 will be described in the following.

The clock signal $\phi_{RES}$ is a one-shot pulse generated at the fall of the row address strobe signal $\overline{RAS}$. By this clock signal $\phi_{RES}$, the clock signal $\phi_P$ becomes equal to the ground potential. Then, at the rise of the clock signal $\phi'_{RES}$, the potential of the clock signal $\phi_P$ becomes as shown in the following equation (3).

$$V1 = Vcc - V_{T1} - V_{T4} \quad (3)$$

where $V_{T1}$ and $V_{T4}$ are threshold voltages of the transistors Q1 and Q4, respectively.

Subsequently, at the rise of the clock signal $\phi_R$, the potential of the clock signal $\phi_P$ becomes as shown by the following equation (4) since the clock signal $\phi_R$ rises to a voltage sufficiently higher than the power supply voltage Vcc.

$$V2 = Vcc - V_{T4} \quad (4)$$

Further, when the row address strobe signal $\overline{RAS}$ rises to start the non-active period, the clock signal $\phi'_P$ rises to a voltage sufficiently higher than the power supply voltage Vcc and accordingly the clock signal $\phi_P$ rises to the power supply voltage Vcc.

In the circuit shown in FIG. 5, there exists a period in which the clock signal $\phi_P$ falls to the ground potential by the clock signal $\phi_{RES}$. However, this is caused by the fact that the circuit for generating the clock signal $\phi_P$ can be easily provided, and it involves no problem in the operation of the active pull-up circuit.

In the circuit for generating the clock signal $\phi_P$ shown in FIG. 5, the threshold voltages of the transistors are selected according to the precharge voltage $V_{PR}$ so as to satisfy the condition of the below indicated equation (5) based on the above indicated equations (1) and (3), whereby the circuit shown in FIG. 5 can be applied to the circuit shown in FIG. 3.

$$V1 = Vcc - V_{T1} - V_{T4} < V_{PR} + V_{R0} \quad (5)$$

Although a case represented by the equation (6):

$$V1 = Vcc - 2 \cdot V_T \quad (6)$$

$$[V_{T1} = V_{T4} = V_T]$$

is shown in connection with the circuit for generating the clock signal $\phi_P$ in FIG. 5, it is easy to obtain a lower value of V1 in the same manner by the below indicated equation (7) or the like.

$$V1 = Vcc - 3 \cdot V_T \quad (7)$$

Figure 6:
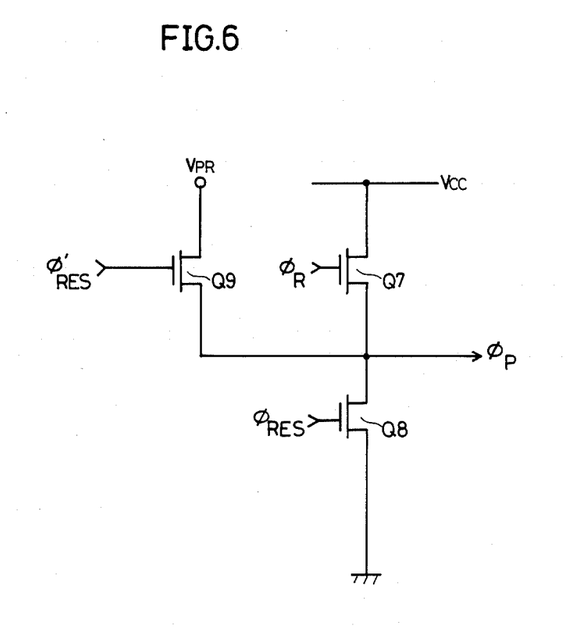
FIG. 6 is a diagram showing another example of the circuit for generating a clock signal $\phi_P$.

Referring to the equation (1) for V1, if the precharge voltage $V_{PR}$ changes for some cause in the operation of the circuit, it is desired that V1 be changed accordingly to always satisfy the condition of the equation (1). FIG. 6 shows an example of the circuit for generating the clock signal $\phi_P$ which meets such desire.

Referring to FIG. 6, transistors Q7 and Q8 connected in series are provided between the power supply Vcc and the ground. The gate of the transistor Q7 receives the clock signal $\phi_R$ and the gate of the transistor Q8 receives the clock signal $\phi_{RES}$. A transistor Q9 is provided between a node of the transistors Q7 and Q8 and the precharge power supply $V_{PR}$. The gate of the transistor Q9 receives the clock signal $\phi'_{RES}$. The clock signal $\phi_P$ is obtained from the node of the transistors Q7 and Q8. In the above described construction, the potential V1 of the clock signal $\phi_P$ becomes $V1 = V_{PR}$ at the rise of the clock signal $\phi'_{RES}$ and, further at the rise of the clock signal $\phi_R$, the potential V2 of the clock signal $\phi_P$ becomes V2 = Vcc. Consequently, the relations of the below indicated equations (8) and (9) are established in the circuit shown in FIG. 6.

$$V1 = V_{PR} \quad (8)$$

$$V2 = Vcc \quad (9)$$

The equations (8) and (9) always satisfy the conditions of the equations (1) and (2) if the precharge voltage $V_{PR}$ is changed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising a plurality of pairs of bit lines connected with a plurality of memory cells, further comprising:
   a sense amplifier provided for each of said pairs of bit lines to bring potential of a bit line of a low level in each of said pairs of bit lines to a ground level after selection of said memory cells, and
   an active pull-up circuit for each of said pairs of bit lines to pull up potential of a bit line of a high level in each of said pairs of bit lines to a power supply potential after operation of said sense amplifier,
   each of said pairs of bit lines being precharged with a potential lower than said power supply potential before said selection of said memory cells,
   said active pull-up circuit comprising:
   a first transistor provided between a power supply and the corresponding one of said bit lines,
   a capacitor having an electrode connected to said first transistor,
   a second transistor provided between said corresponding one of said bit lines and said electrode of said capacitor,
   signal voltage applying means for applying, to another electrode of said capacitor, signal voltage for raising a gate potential of said first transistor through said capacitor, and
   gate potential control means for controlling a gate potential of said second transistor, said gate potential control means being adapted to control the gate potential so as not to turn on said second transistor during a period from the start of operation of said sense amplifier to the end of operation of said active pull-up circuit.

2. A semiconductor memory device in accordance with claim 1, wherein
   said gate potential control means maintains the gate potential of said second transistor to a first potential lower than a voltage obtained as a sum of a precharge potential of said bit lines and a threshold voltage of said second transistor at least during a period from the start of operation of said sense amplifier to the start of operation of said active pull-up circuit.

3. A semiconductor memory device in accordance with claim 2, wherein
   said gate potential control means raises, at least once, the gate potential of said second transistor to a second potential higher than said first potential and lower than a voltage obtained as a sum of said power supply potential and the threshold voltage of said second transistor, during a period from the start of operation of said active pull-up circuit to the end of the operation thereof.

4. A semiconductor memory device in accordance with claim 3, wherein
   said gate potential control means raises the gate potential of said second transistor to said second potential only when data stored in said memory cells is rewritten.

5. A semiconductor memory device in accordance with claim 2, wherein
   said gate potential control means changes the value of said first potential according to change of the precharge potential of said bit lines.

* * * * *